(12) United States Patent
Kim

(10) Patent No.: US 7,016,229 B2
(45) Date of Patent: Mar. 21, 2006

(54) PAGE BUFFER FOR NAND FLASH MEMORY

(75) Inventor: Doe Cook Kim, Daekukwangyeok (KR)

(73) Assignee: Hynix Semiconductor, Inc., Kyungki-Do (KR)

(*) Notice: Subject to any disclaimer, the term of this patent is extended or adjusted under 35 U.S.C. 154(b) by 169 days.

(21) Appl. No.: 10/737,625

(22) Filed: Dec. 16, 2003

(65) Prior Publication Data
US 2004/0141402 A1     Jul. 22, 2004

(30) Foreign Application Priority Data
Jan. 22, 2003   (KR)   ................................ 2003-04201

(51) Int. Cl.
*G11C 16/04*     (2006.01)
(52) U.S. Cl. .................. 365/185.17; 365/230.17; 365/189.05; 365/185.25
(58) Field of Classification Search ........... 365/185.17, 365/230.08, 189.05, 185.25, 185.33
See application file for complete search history.

(56) References Cited

U.S. PATENT DOCUMENTS

| | | | |
|---|---|---|---|
| 6,717,857 B1 * | 4/2004 | Byeon et al. ........... | 365/185.21 |
| 6,813,184 B1 * | 11/2004 | Lee ....................... | 365/185.09 |
| 6,826,082 B1 * | 11/2004 | Hwang et al. ......... | 365/185.17 |
| 2003/0117856 A1 * | 6/2003 | Lee et al. .............. | 365/189.05 |

* cited by examiner

*Primary Examiner*—Van Thu Nguyen
*Assistant Examiner*—Toan Le
(74) *Attorney, Agent, or Firm*—Marshall, Gerstein & Borun LLP

(57) ABSTRACT

A page buffer for an NAND flash memory, including: a first latch for loading data; a second latch for storing data stored on a cell depending on a bit line selection signal; a setting circuit for setting the first latch to a high level to load data in a high level; a first switching circuit for transferring the data stored on the second latch depending on a data output signal of a page buffer; a discharging circuit for discharging charges on a data line; a second switching circuit for connecting the data line discharged by the discharging circuit to the first latch depending on a data control signal to load the data in a low level to the first latch; and a data transferring circuit for transferring the data of the first latch to the second latch.

5 Claims, 4 Drawing Sheets

US 7,016,229 B2

PAGE BUFFER FOR NAND FLASH MEMORY

BACKGROUND

1. Field of the Invention

The present invention relates to a page buffer for an NAND flash memory and, more specifically, to a pager buffer for an NAND flash memory capable of improving data loading speed depending on contents of data to be programmed.

2. Discussion of Related Art

Recently, demands for semiconductor memory devices capable of electrically programming, erasing and storing data, even in case that a power source is not supplied, has been increased. Further, in order to develop a large capacity memory device capable of storing an amount of data, a high-integration technology of a memory cell has been developed. As a result, an NAND type of a flash memory device, in which a plurality of memory cells are serially connected to constitute one string and a memory cell array includes a plurality of strings, has been proposed.

A flash memory cell of the NAND flash memory device comprise a current path formed between a source and a drain on a semiconductor substrate, and a floating gate and a control gate formed between insulating layers on the semiconductor substrate. A programming operation of the flash memory cell is generally accomplished by grounding the source and the drain areas of the memory cell and the semiconductor substrate of a bulk area, and applying a high positive voltage (program voltage; Vpp, for example, 15V~20V) to a control gate to generate fowler-nordheim tunneling (referred to as "F-N tunneling") between a floating gate and the semiconductor substrate. The F-N tunneling means that electrons of the bulk area are accumulated on the floating gate by an electric field of the high voltage (Vpp) applied to the control gate to increase a threshold voltage of the memory cell.

An erasing operation of the flash memory cell is concurrently performed in unit of sectors sharing the bulk area, by applying a high negative voltage (erase voltage: Vera, for example, −10V) to the control gate and a predetermined voltage (for example, 5V) to the bulk area to generate the F-N tunneling. By the F-N tunneling, electrons accumulated on the floating gate are discharged into the source area, so that the flash memory cells have an erasing threshold voltage distribution in the range of approximately '−2V to −3V'. In the cell of which the threshold voltage is heightened by the programming operation, since the current flowing from the drain area to the source area is prevented during a read-out operation, it seems like that the cell is turned-off. On the other hand, in the cell of which the threshold voltage is dropped down by the erasing operation, since the current flowing from the drain area to the source area is available, it seems like that the cell is turned-on.

A general NAND flash memory device comprises a memory cell array, a page buffer and a column decoder. In addition, the general NAND flash memory device further comprises a control logic unit, a row decoder, an address buffer, or the like. The memory cell array includes a plurality of memory cell strings connected to a plurality of bit lines, which are extended in a column direction.

Each memory cell string has a plurality of floating gate type memory cells serially connected to each other. A plurality of word lines are extended in a row direction, and the control gate of each memory cell is connected to the corresponding the word line. The page buffer comprises a plurality of page buffers connected between the bit lines and the column decoder. The column decoder is connected between the page buffer and the data lines.

FIG. 1 is a circuit diagram of a conventional page buffer for an NAND flash memory.

In order to load data to a first latch 10, a data line discharging signal DL_DIS of FIG. 2A is activated in a high level. Therefore, an NMOS transistor N7 is turned-on to discharge charges of the corresponding data line. A data input DI or nDI of the page buffer to be selected depending on a desired column address Y-ADDRESS is enabled depending on the data (having a high level or a low level) to be input.

For example, when the data input DI is in a high level, an NMOS transistor N1 is turned-on, so that voltage of a node Q1 of the first latch 10 becomes a high level. On the contrary, when the data input nDI is in a high level, an NMOS transistor N8 is turned-on, so that voltage of the node Q1 becomes a low level.

Procedures of transferring data will be described referring to FIG. 2B.

When a main reset bar signal MRSTb drops down to a low level, a PMOS transistor P3 is turned-on, so that a node K1 becomes a high level. Therefore, an output Q2 of a second latch 30 is maintained in a low level. When a precharge bar signal PRECHb drops down to a low level, a PMOS transistor P2 is turned-on to maintain a gate of an NMOS transistor N10 in a high level. At that time, if a page dump signal PDUMP is in a high level, data stored on the first latch 10 is transferred to a gate terminal of an NMOS transistor N9. When a main latch signal MLCH is in a high level, the gate of the NMOS transistor N10 is maintained in a high level. When an output of the first latch 10 is in a high level, the NMOS transistor N9 is turned-on, and then the NMOS transistor N10 is turned-on for the period of the main latch signal MLCH being in a high level, so that a voltage of the node K1 becomes a low level. Therefore, the second latch 30 stores a high level. In other words, the data of the first latch 10 is transferred to the second latch 30.

After transferring, the bit line selection signal BLSLT is in a high level, the NMOS transistor N2 is turned-on to transfer the data stored on the second latch 30 to the memory cell through the bit line.

The read-out operation of the memory cell will be described, as follows.

The NMOS transistor N2 is turned-on depending on the bit line selection signal, so that the data stored on the memory cell is stored on the second latch 30. When a page buffer data output signal PBDO is activated, the NMOS transistor N1 is turned-on, so that the data stored on the second latch 30 is transferred to the data line through the column selector (Y-selector) 20.

In the aforementioned conventional page buffer, since the data loading operation is carried out from the first address to the last address regardless of contents of data to be programmed when loading data, the NMOS transistors receiving the data input DI, nDI as a control signal are required. Thus, there is a problem that a chip area becomes larger because of area occupied by the NMOS transistors.

SUMMARY OF THE INVENTION

The Accordingly, the present invention is directed to provide a page buffer of an NAND flash memory capable of reducing chip area with increasing a data loading speed.

One aspect of the present invention provides a page buffer for an NAND flash memory, comprising: a first latch for loading data; a second latch for storing data stored on a cell depending on a bit line selection signal; a setting mean for setting the first latch to a high level to load data in a high level; a first switching mean for transferring the data stored on the second latch depending on a data output signal of a page buffer; a discharging mean for discharging charges on a data line; a second switching mean for connecting the data line discharged by the discharging mean to the first latch depending on a data control signal to load the data in a low level to the first latch; and a data transferring mean for transferring the data of the first latch to the second latch.

In the aforementioned of a page buffer for an NAND flash memory, the first switching mean preferably comprises a first NMOS transistor, which is connected between the bit line and the second latch, and operated depending on a bit line selection signal.

In the aforementioned of a page buffer for an NAND flash memory, the setting mean comprises a PMOS transistor, which is connected between a power and the first latch, and operated depending on a cache set bar signal.

In the aforementioned of a page buffer for an NAND flash memory, the second switching mean comprises a second NMOS transistor, which is connected between the first latch and the data line, and turned-on depending on the data control signal.

Further, in the aforementioned of a page buffer for an NAND flash memory, the discharging mean comprises a third NMOS transistor which is connected between the data line and a ground, and turned-on depending on a data line discharging signal.

BRIEF DESCRIPTION OF THE DRAWINGS

The aforementioned aspects and other features of the present invention will be explained in the following description, taken in conjunction with the accompanying drawings, wherein.

DETAILED DESCRIPTION OF PREFERRED EMBODIMENTS

Now, embodiments of the present invention will be described in detail with reference to the accompany drawings.

Figure 1:
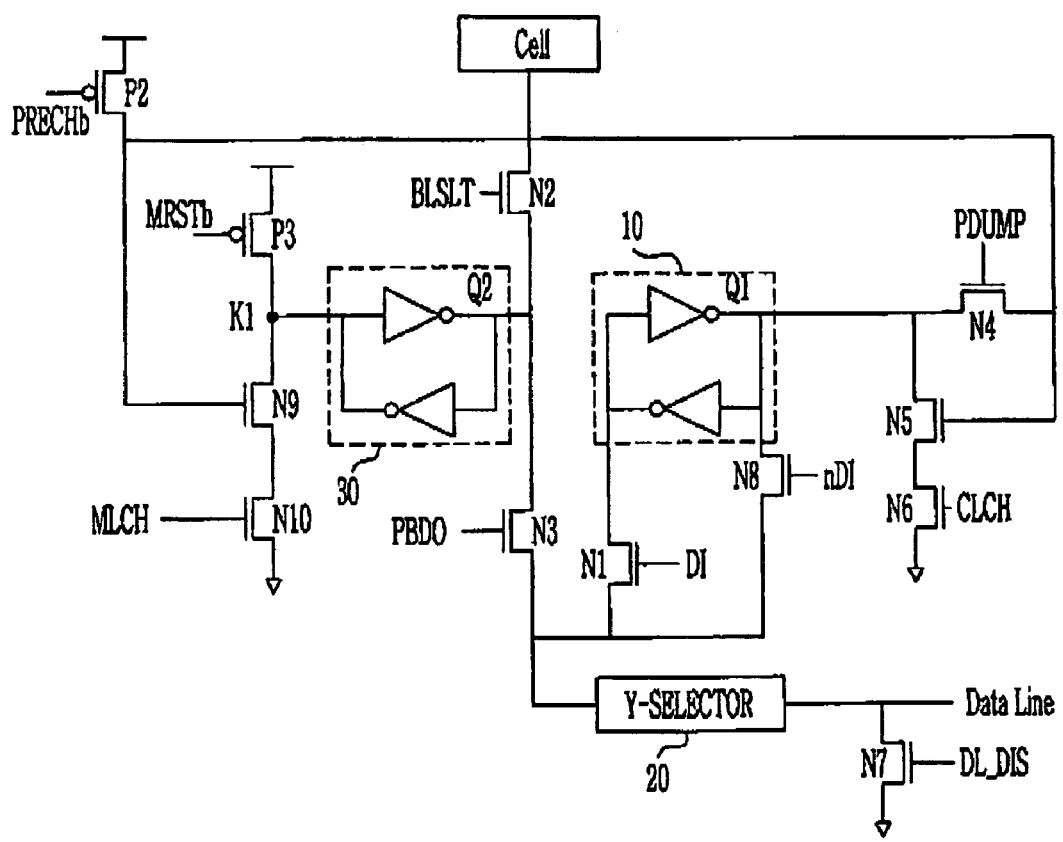
FIG. 1 is a circuit diagram of a conventional page buffer for an NAND flash memory.
Figure 2A:
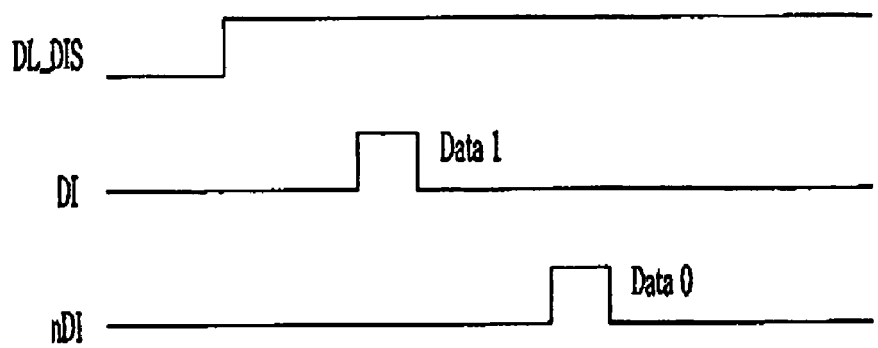
FIGS. 2A and 2B are waveform diagrams illustrating operations of the page buffer of FIG. 1.
Figure 2B:
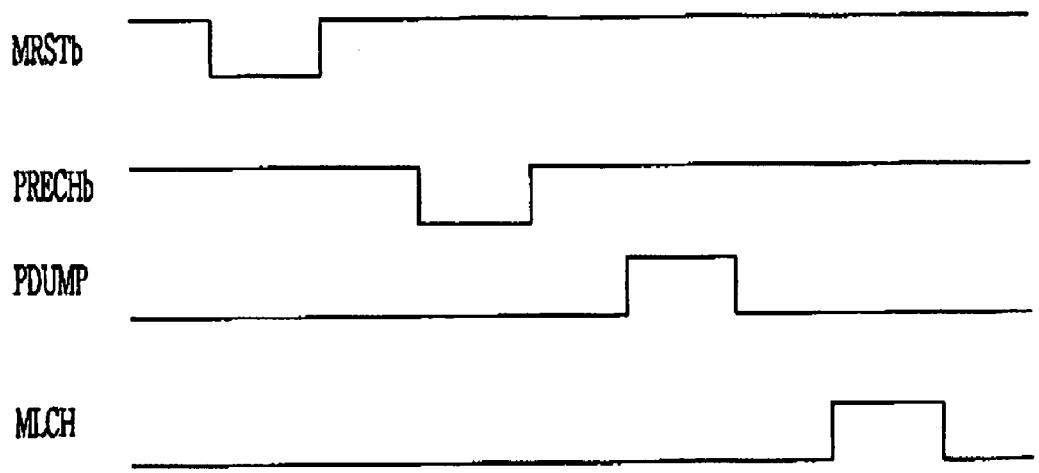
Figure 3:
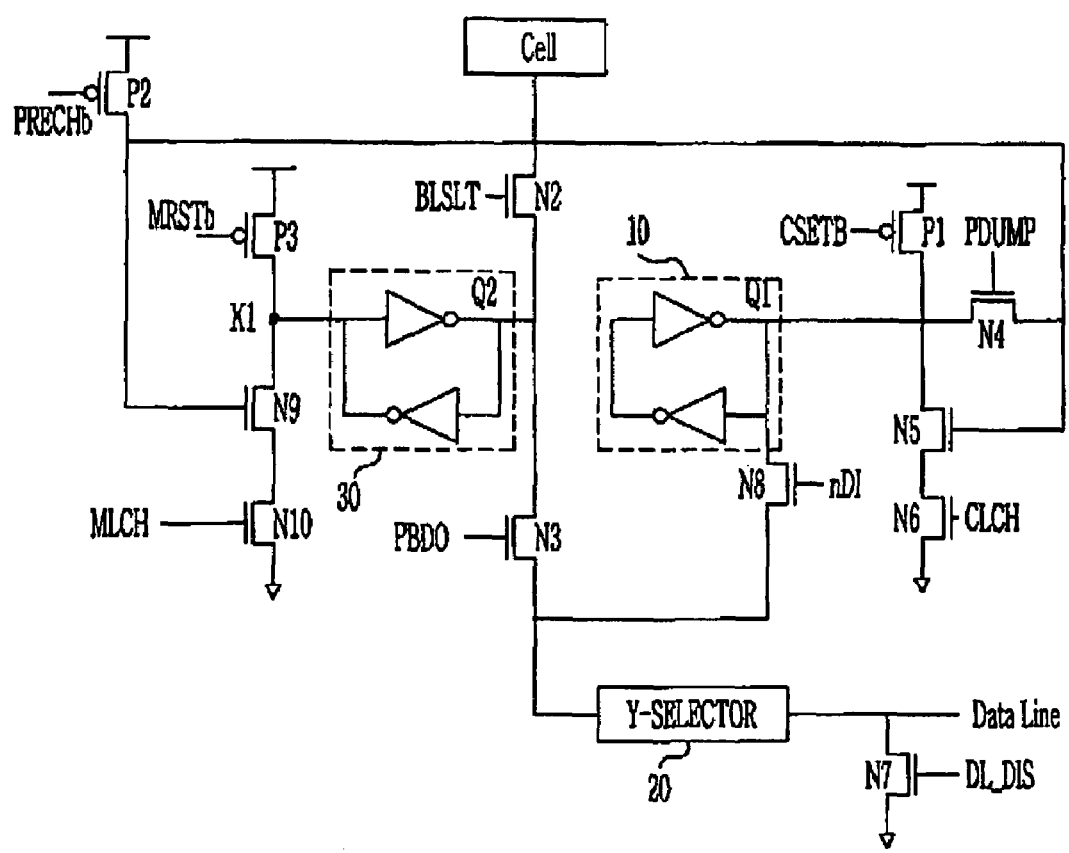
FIG. 3 is a circuit diagram of a page buffer for an NAND flash memory according to the present invention.

FIG. 3 is a circuit diagram showing a page buffer of an NAND flash memory according to the present invention. The operation of the NAND flash memory circuit diagram will be described with reference to FIGS. 4A and 4B.

An NMOS transistor N2 is turned-on depending on a bit line selection signal, so that the data stored on a memory cell is stored on a second latch 30. When a page buffer data output signal PBDO is activated, an NMOS transistor N1 is turned-on, so that the data stored on the second latch 30 are transferred to a data line through a column selector (Y-selector) 20.

Figure 4A:
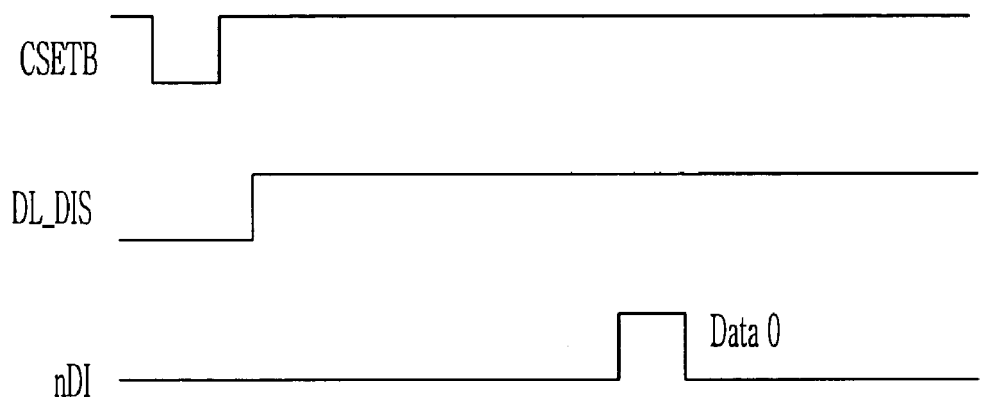
FIGS. 4A and 4B are waveform diagrams illustrating operations of the page buffer of FIG. 3.

In order to load data to a latch 10, a cache set bar signal CSETB of FIG. 4A is in a low level, so that a node Q1 of the first latch 10 becomes a high level. When a data line discharge signal DL_DIS is activated in a high level, an NMOS transistor N7 is turned-on, so that charges on the data line are discharged. The only corresponding column address (Y-ADDRESS) of the page buffer to be programmed is selected and the data input nDI is used, so that the voltage of the node Q1 becomes a low level.

In other words, to load the latch 10 to a high level, it is necessary that the cache set bar signal CSETB is in a low level. On the contrary, in order to load the latch 10 to a low level, when the data line discharge signal DL_DIS is activated in a high level and data input nDI is in a high level, the NMOS transistor N8 is turned-on to load a low level on the first latch 10. In order to measure electrical characteristics of the cells connected to the bit lines, a control signal $T_{CELLIV}$ is activated to turn-on the NMOS transistor N9.

Figure 4B:
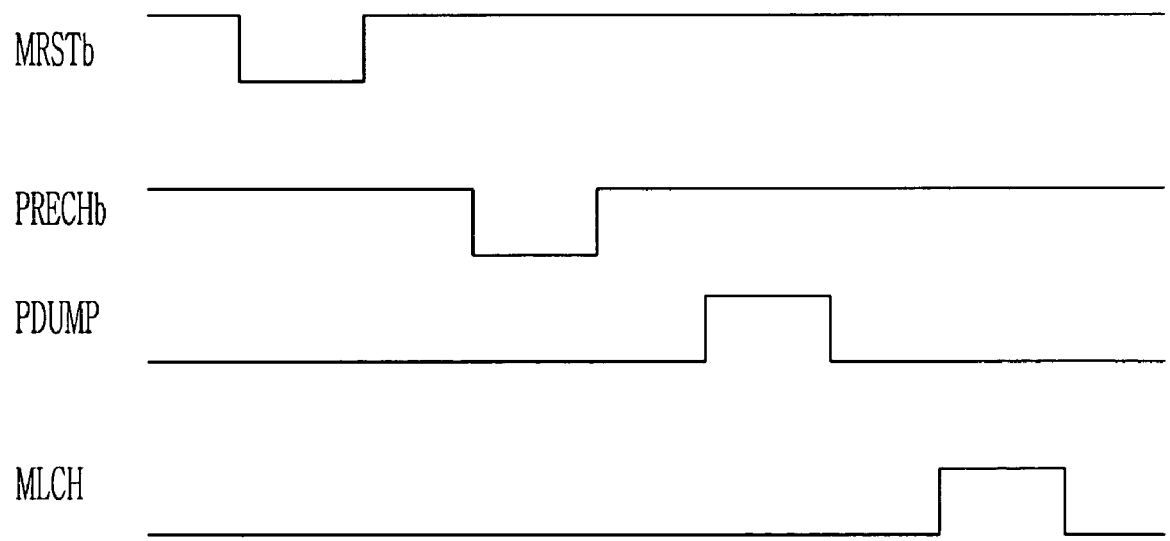

Procedures of transferring data will be described with reference to FIG. 4B.

When a main reset bar signal MRSTb is in a low level, a PMOS transistor P3 is turned-on, so that a node K1 is in a high level. Therefore, an output Q2 of the second latch 30 is maintained in a low level. When the precharge bar signal PRECHb drops down to a low level, the PMOS transistor P2 is turned-on to maintain a gate of the NMOS transistor N10 in a high level, and when the page dump signal PDUMP is in a high level, data stored on the first latch 10 is transferred to a gate terminal of the NMOS transistor N9. When the main latch signal N10 is maintained in a high level, a gate of the NMOS transistor N10 is maintained in a high level. When an output of the first latch 10 is in a high level, the NMOS transistor N9 is turned-on, and then the NMOS transistor N10 is turned-on during the period of the main latch signal MLCH being in a high level, so that voltage of the node K1 becomes a low level. Therefore, the second latch 20 stores a high level. In other words, date of the first latch 10 is transferred to the second latch 30.

After transferring, when the bit line selection signal BLSLT is in a high level, the NMOS transistor N2 is turned-on to transfer the data stored on the second latch 30 to the memory cells through the bit lines.

Read-out operation of the memory cell will be described as follows.

The NMOS transistor N2 is turned-on, so that data stored on the memory cell is stored on the second-latch 30. When the page buffer data output signal PBDO is activated, the NMOS transistor N1 is turned-on, so that data stored on the second latch 30 is transferred to the data line through the column selector (Y-Selector) 20.

In the embodiment of the present invention, since the data input DI is not required, the data loading speed of the page buffer is increased, and a transistor structure for processing the data input DI is not required, so that a structure of the page buffer is simplified.

As described above, according to the present invention, it is possible to simplify a structure of the page buffer and improve the data loading speed. Furthermore, since paths directly connected to the cells are provided, it is possible to measure a cell current.

In the above description, although the present invention has been described in detail using the specific embodiments, the present invention is not limited to the embodiments, but improvements and modifications can be made by the skilled in the art without departing from the spirit of the present invention, and the scope of the present invention is limited by claims as follows.

What is claimed is:

1. A page buffer for an NAND flash memory, comprising:
a first latch connected to a first node for storing and loading data;

a second latch for storing data stored on a cell depending on a bit line selection signal;

a setting means connected between the first node and a power so that the data stored on the first latch is set to a high level for inhibiting the cell from programming;

a first switching means for transferring the data stored on the second latch to a data line depending on a page buffer data output signal;

a discharging means for discharging charges on the data line;

a second switching means for connecting the data line discharged by the discharging means to the first node depending on a data control signal so that the data stored on the first latch is changed to a low level for programming the cell; and a data transferring means for transferring the data of the first latch to the second latch.

2. A page buffer for an NAND flash memory according to claim 1, wherein the first switching means comprises a first NMOS transistor, which is connected between a bit line and the second latch, and operated depending on the bit line selection signal.

3. A page buffer for an NAND flash memory according to claim 1, wherein the setting means comprises a PMOS transistor, which is connected between the power and the first node, and operated depending on a cache set bar signal.

4. A page buffer for an NAND flash memory according to claim 1, wherein the second switching means comprises a second NMOS transistor, which is connected between the first node and the data line, and turned-on depending on the data control signal.

5. A page buffer for an NAND flash memory according to claim 1, wherein the discharging means comprises a third NMOS transistor, which is connected between the data line and a ground, and turned-on depending on a data line discharging signal.

* * * * *